United States Patent [19]

Cloke

[11] 4,071,832
[45] Jan. 31, 1978

[54] CURRENT CONTROLLED OSCILLATOR
[75] Inventor: Robert L. Cloke, Santa Clara, Calif.
[73] Assignee: Sperry Rand Corporation, New York, N.Y.
[21] Appl. No.: 695,828
[22] Filed: June 14, 1976
[51] Int. Cl.² .............................................. H03B 5/12
[52] U.S. Cl. .................................. 331/117 R; 331/168
[58] Field of Search ................... 331/111, 115, 117 R, 331/168

[56] References Cited
U.S. PATENT DOCUMENTS

| | | | |
|---|---|---|---|
| 2,852,680 | 9/1958 | Radcliffe, Jr. | 331/115 |
| 3,205,352 | 9/1965 | Prucha | 331/117 |
| 3,286,199 | 11/1966 | Skilling | 331/168 |
| 3,364,465 | 1/1968 | Prucha | 331/117 |
| 3,378,790 | 4/1968 | Bray | 331/168 |
| 3,649,929 | 3/1972 | Thompson | 331/117 R |
| 3,986,152 | 10/1976 | Howell | 331/115 |

OTHER PUBLICATIONS

IBM, Tech. Disc. Bul., vol. 14, No. 12, May 1972, "Neg. Resis. Osc.", S.E. Bigbie, p. 3803.
Radio-Electronics, "Emitter-Coupled Osc. Circ.," Fred Maynard, May 1970, pp. 33-35.

Primary Examiner—John Kominski
Attorney, Agent, or Firm—Gerald L. Moore

[57] ABSTRACT

An oscillator utilizing a pair of transistors interconnected with a resonance circuit in the collector circuits thereof such that by regulation of the current flow to the connected emitters, the frequency of oscillation is regulated.

2 Claims, 3 Drawing Figures

CURRENT CONTROLLED OSCILLATOR

BACKGROUND OF THE INVENTION

This invention relates to a simple and relatively inexpensive oscillator utilizing few components, yet offering the advantages of generating a variable frequency output by regulation of the current input to the transistors.

DESCRIPTION OF THE INVENTION

Figure 1:
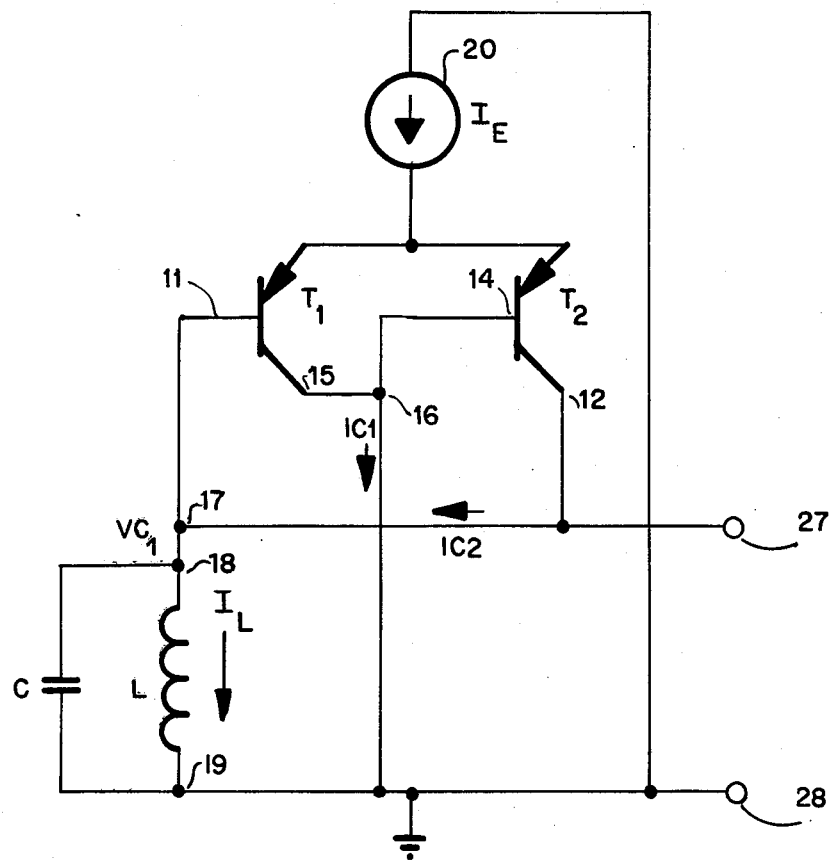
FIG. 1 is a circuit showing a preferred embodiment of the invention.

In FIG. 1 is shown a preferred embodiment of the invention comprising a first transistor T1 and a second transistor T2. A first circuit connects the base 11 of transistor T1 to the collector 12 of the transistor T2. A second circuit connects the base 14 of transistor T2 to the collector 15 of transistor T1. These transistors are cross-connected such that an increase of the collector voltage of one transistor will tend to increase the current flow out of the collector of that transistor up to a maximum current limit, IE. While the foregoing statement is precisely true only for PNP transistors, this general principle also applies for NPN transistors. Thus the transistors are connected by a circuit to effect negative incremental conductance therethrough. While transistors are described, other devices having fixed or adustable negative resistance with fixed or variable limiter will function similarly in the subject invention.

Connected across these first and second circuits between the junctures 16 and 17 is a resonance circuit in the form of an LC parallel circuit comprising an inductor L and a capacitor C in parallel connection between the terminals 18 and 19. In this embodiment, the junction 19 is connected to ground.

For controlling the frequency of oscillation of this circuit, a current supply $I_E$ is connected to a third circuit joining the emitters of the transistors $T_1$ and $T_2$. A return circuit from the junction 19 is connected to the input of the current supply. This current source need not be an ideal current source and in practice can be a series combination of a voltage source and resistor.

With the transistors interconnected in the manner shown, the circuit will oscillate at a frequency dependent upon the level of current supplied by the current source $I_E$. Operation of the circuit is as follows:

1. Assuming $T_1$ has just turned off and $T_2$ is initiating conduction, the voltage $V_{C1}$ equals 0, the current $I_L$ equals 0 and the current $I_{C1}$ equals 0 and $I_{C2} \cong IE$.

Figure 2A:
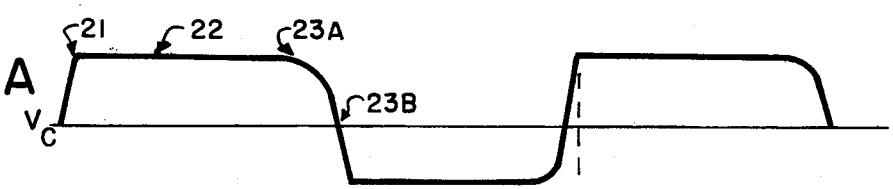
FIGS. 2A and 2B are curves representing the collector to base voltage and current of each transistor.
Figure 2B:
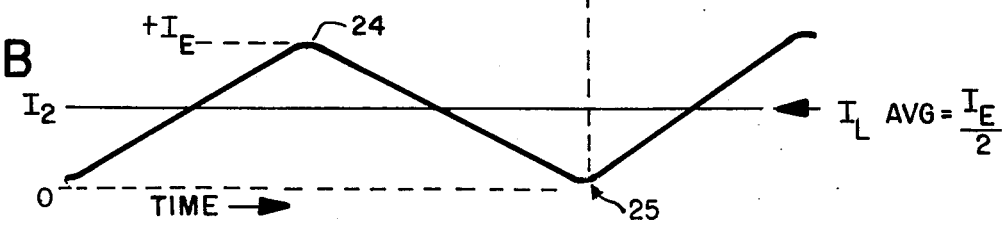

2. The capacitor C will charge at a rate of dv/dt equals $I_{C2}$ until the transistor $T_2$ becomes saturated. This point is reached in FIG. 2 at the breakpoint 21 of the curve 22 in FIG. 2A.

3. The inductor current $I_L$ then increases at a rate of $dI_L/dt$ equals V/L where V is the collector-to-base saturation voltage of the transistor $T_2$.

4. As the current $I_L$ approaches the value of $IC_2$, the voltage across the inductor must return to 0 as the rate of change of current goes to 0. However, the capacitor across the inductor causes this transition to follow a cosinusoidal-like waveshape between points 23a and 23b on curve 22. When the capacitor voltage passes through 0 (therefore the inductor current is maximum since $V_C = V_L = I_L/dt=0$). $T_2$ will switch off and $T_1$ will switch on.

5. Thereafter the same sequence takes place with the transistor $T_1$ conducting instead of the transistor $T_2$, the inductor current now decreasing toward 0 from its initial value.

Thus it can be seen that there is supplied a relatively simple oscillator with the rate of oscillation being controlled by the value of the current $I_E$. The value of this current controls the rate of oscillation because it determines the level of the current $I_L$ which the inductor must ultimately conduct, which in turn determines the time for the charging of the inductor L at a constant terminal voltage. The oscillating signal is detected at the terminals 27 and 28 of the circuit in FIG. 1.

The invention claimed is:

1. A transistor oscillator comprising, in combination:
   first and second transistors;
   a current source connected to supply current to each transistor emitter;
   a first circuit including a short circuit conductor connected between the base of said first transistor and the collector of said second transistor;
   a second circuit including a short circuit conductor connected between the base of said second transistor and the collector of said first transistor;
   a resonance circuit connecting said first and second circuits;
   a current return path from one said circuit to the current supply whereby oscillatory signals will be generated in the circuits;
   means to regulate the current flow from the source through the transistors to provide current at levels exceeding the saturation of the transistors to vary the frequency range of the oscillator signals; and
   means to detect the frequency of oscillation across the resonance circuit.

2. A transistor oscillator as defined in claim 1 wherein said resonance circuit is an LC parallel circuit.

* * * * *